(12) United States Patent
Yoneda et al.

(10) Patent No.: US 6,448,583 B1
(45) Date of Patent: Sep. 10, 2002

(54) OPTICAL SEMICONDUCTOR MODULE, ITS MANUFACTURE, REFLECTION FILM, ITS MANUFACTURE, AND LASER AND OPTICAL DEVICES USING REFLECTION FILM

(75) Inventors: Yoshihiro Yoneda; Akira Fukushima, both of Yamanashi; Hajime Shoji; Haruhisa Soda, both of Kawasaki, all of (JP)

(73) Assignees: Fujitsu Limited, Kawasaki; Fujitsu Quantum Devices Limited, Yamanashi, both of (JP)

( * ) Notice: Subject to any disclaimer, the term of this patent is extended or adjusted under 35 U.S.C. 154(b) by 0 days.

(21) Appl. No.: 09/392,239

(22) Filed: Sep. 8, 1999

(30) Foreign Application Priority Data

| Sep. 8, 1998 | (JP) | 10-254335 |
| Mar. 16, 1999 | (JP) | 11-070346 |
| Jul. 14, 1999 | (JP) | 11-200254 |
| Jul. 23, 1999 | (JP) | 11-209020 |

(51) Int. Cl.$^7$ .............................................. H01L 27/15
(52) U.S. Cl. .............................. 257/81; 257/80; 257/98; 257/99
(58) Field of Search ........................... 257/80, 81, 98, 257/99, 432, 433; 385/49; 372/96

(56) References Cited

U.S. PATENT DOCUMENTS

| 6,137,121 A | * | 10/2000 | Yamamoto et al. | 257/80 |
| 6,222,967 B1 | * | 4/2001 | Amano et al. | 385/49 |
| 6,320,893 B1 | * | 11/2001 | Ueki | 372/96 |

FOREIGN PATENT DOCUMENTS

| DE | 4130175 A1 | 3/1993 |
| DE | 41 34 548 A1 | 4/1993 |
| DE | 36 88 226 T2 | 11/1993 |
| DE | 195 09 793 C2 | 4/1997 |
| DE | 4134548 A1 | 9/1997 |
| EP | 0 664 586 A1 | 7/1995 |
| JP | 2-152285 | 6/1990 |
| JP | 8-18163 | 1/1996 |
| JP | 8-240739 | 9/1996 |

OTHER PUBLICATIONS

Gerthsen et al., "Ein Lehrbuch zum Gebrauch neben Vorlesungen", *Physik*, Springer–Verlag Berlin (Aug. 13, 1982), ISBN3–540–11369–X S.460–461.

Bergmann–Schaefer., "Band III Optik", *Lehrbuch der Experimentalphysik*, (Aug. 8, 1987), ISBN3–010882–8, S.493–502.

Eugene Hecht, Optik, ISBN 3–925118–86–1, Addison-–Wesley Publishing Company, Bonn (1989) pp. 396–399.

German Office Action dated Sep. 3, 2001 and translation.

* cited by examiner

*Primary Examiner*—Hoai V. Ho
*Assistant Examiner*—Mai-Huong Tran
(74) *Attorney, Agent, or Firm*—Armstrong, Westerman & Hattori, LLP

(57) ABSTRACT

An optical semiconductor element and an optical element having an optical coupling facet are disposed on a support surface of a platform. The optical element is optically coupled to the optical semiconductor element at the optical coupling facet. A protective member covers the optical semiconductor element and is disposed at least in a light transmission area in a space between the semiconductor element and the optical coupling facet of the optical element. The protective member is made of gel acrylic modification resin. An optical semiconductor module having a sufficient moisture resistance and being suitable for low cost is provided.

19 Claims, 10 Drawing Sheets

OPTICAL SEMICONDUCTOR MODULE, ITS MANUFACTURE, REFLECTION FILM, ITS MANUFACTURE, AND LASER AND OPTICAL DEVICES USING REFLECTION FILM

This application is based on Japanese Patent Applications HEI 10-254335, filed on Sep. 8, 1998, HEI 11-70346, filed on Mar. 16, 1999, HEI 11-200254, filed on Jul. 14, 1999, and HEI 11-209020 filed on Jul. 23, 1999, the entire contents of which are incorporated herein by reference.

BACKGROUND OF THE INVENTION a) Field of the Invention

The present invention relates to an optical semiconductor module having an optical semiconductor element which is resin-sealed to improve moisture resistance, its manufacture method, a reflection film, its manufacture method, and laser and optical devices using reflection films.

b) Description of the Related Art

With the advent of multimedia societies, subscriber networks are now vigorously changed to optical networks. In order to prevail optical fibers to subscriber networks, it is necessary to lower the cost of optical components, particularly optical semiconductor modules which have a large influence upon the total cost.

Conventional low price optical semiconductor modules have been manufactured by a simple coupling method of coupling an optical semiconductor element and an optical waveguide such as an optical fiber on an Si platform or by a simple sealing method of sealing an optical semiconductor element by directly potting resin. These methods can reduce the number of components and lower the cost. Conventional solder sealing has been replaced by cheap resin sealing to lower the cost required for protecting an optical semiconductor element from external moisture.

Epoxy resin transparent to reception/emission light has been used as sealing resin. The publication of JP-A-HEI-8-18163 discloses a double sealing structure which covers an optical semiconductor element with silicone resin having rubber elasticity and also covers the silicone resin coated the optical semiconductor element with epoxy resin which shields sun light and water contents.

Although epoxy resin has a high moisture resistance, it has a large coefficient of linear expansion so that the optical semiconductor element may be damaged by a resin volume change to be caused by a temperature change. When LSI using Si or other components is resin-sealed, epoxy resin is mixed with filler such as silica in order to relax thermal stress to be applied to the semiconductor element. However, when an optical semiconductor element is resin-sealed, the resin cannot be mixed with filler because it is necessary to provide optical coupling between the optical semiconductor element and an optical fiber.

If silicone resin is used as the sealing resin, thermal stress applied to an optical semiconductor element can be relaxed because it has rubber elasticity. However, since silicone resin has higher moisture permeability than epoxy resin, it is difficult to ensure a sufficient moisture resistance of an optical semiconductor module.

Double sealing with silicone resin and epoxy resin can relax thermal stress while the moisture resistance is retained. It is, however, necessary to perform at least two resin curing processes because the curing conditions of two types of resin are different. This increases the number of manufacture processes, and contradicts the demands of low cost. An insufficient strength of uncured resin is likely to occur.

Next, issues regarding resin sealing will be described by paying attention to an optical viewpoint.

A reflection film of a multi-layer structure is know which is a lamination of two or more thin films having an optical film thickness of a quarter wavelength of light to be reflected. If this reflection film of the multi-layer structure is formed on the facets of an optical resonator of a laser diode, the laser diode can have a low threshold current, a high output, and the like.

The fundamental parameters as indices of the laser characteristics of a semiconductor laser device having a pair of resonator facets include a threshold gain, an external differential quantum efficiency, a front/back ratio, and a slope efficiency. The threshold gain is defined by:

$$g_{th} = \alpha_i + (1/L)\ln(1/(R_f R_r)^{1/2})$$

where $\alpha_i$ is an internal loss of an optical resonator, L is a resonator length, $R_f$ and $R_r$ are reflectivities at the front and back facets.

The external differential quantum efficiency $\eta_d$ is defined by:

$$\eta_d = \eta_i \times \ln(1/R) / (\alpha_i L + \ln(1/R))$$

where $\eta_i$ is an internal quantum efficiency and an assumption of $R = R_f = R_r$ is incorporated.

The front/back ratio r is defined by:

$$r = ((1-R_f)/(1-R_r)) \times (R_r/R_f)^{1/2}.$$

The slope efficiency $S_d$ is defined by:

$$S_d = 1.24 \times \eta_d / \lambda$$

where $\lambda$ is an oscillation wavelength.

As seen from the above definition equations, as the reflectivities $R_f$ and $R_r$ lower, the threshold gain $g_{th}$ lowers although the external differential quantum efficiency $\eta_d$ and slope efficiency $S_d$ become high. Namely, the threshold current increases. An increase of the threshold current may degrade the optical output characteristics, particularly under the high temperature operation environment.

Evaluation of the laser diode characteristics is generally performed in the atmospheric air or in an inert gas atmosphere. In actual operation, a laser diode is mounted on a substrate and thereafter covered with resin or the like. As the reflection facet of an optical resonator is covered with resin, the reflectivity lowers and the threshold gain $g_{th}$ increases. Therefore, it is difficult to evaluate the optical output characteristics under the actual operation conditions.

SUMMARY OF THE INVENTION

It is an object of the present invention to provide an optical semiconductor module having a sufficient moisture resistance and is easy to be made low in cost, and its manufacture method.

It is another object of the present invention to provide a reflection film, its manufacture method, and a semiconductor laser device, capable of evaluating the characteristics of the semiconductor laser device under the conditions approximate to the actual operation conditions.

According to one aspect of the present invention, there is provided an optical semiconductor module comprising: a platform having a support surface; an optical semiconductor element disposed on the support surface of the platform; an optical element disposed on the support surface of the platform and having an optical coupling facet, the optical element being optically coupled to the optical semiconductor element at the optical coupling facet; and a protective member made of gel acrylic modification resin, covering the optical semiconductor element, and being disposed at least in a light transmission area in a space between the semiconductor element and the optical coupling facet of the optical element.

Since the protective member is made of gel resin, a thermal stress applied to the optical semiconductor element can be reduced. Since the acrylic modification resin has a low moisture permeability and moisture absorption, it is possible to prevent water contents from invading into the optical semiconductor element.

According to another aspect of the present invention, there is provided a method of manufacturing an optical semiconductor module comprising the steps of: disposing an optical semiconductor element and an optical element on a support surface of a platform so as to optically coupling the optical semiconductor device and the optical element; placing the platform on an inner surface of an outer frame, with ultraviolet curing type adhesive being interposed between the platform and the inner surface; disposing an acrylic modification resin composition covering the semiconductor element on the platform and being filled in a light transmission area between the optical semiconductor element and the optical element, the acrylic modification resin composition being cured upon radiation of ultraviolet rays and becoming gel; and curing the adhesive and the acrylic modification resin composition by radiating ultraviolet rays.

Both the adhesive and acrylic modification resin composition can be cured at the same time by one ultraviolet ray radiation process, so that the number of manufacture processes can be reduced.

According to another aspect of the present invention, there is provided a method of manufacturing a reflection film comprising the steps of: preparing an optical medium having a reflection surface and a refractive index $n_0$; determining a wavelength $\lambda$ of light to be reflected; determining two different reference refraction indices $ns_1$ and $ns_2$; laminating k (k is a positive integer) pairs of a first layer having a refractive index $n_1$ and a second layer having a refractive index $n_2$ on the reflection surface of the optical medium, wherein a thickness of the first layer is:

$$(\lambda/4+(\lambda/2)\times N_1)/n_1$$

where $N_1$ is 0 or a positive integer, and a thickness of the second layer is:

$$(\lambda/4+(\lambda/2)\times N_2)/n_2$$

where $N_2$ is 0 or a positive integer; determining a thickness $d_3$ of a third layer having the refractive index $n_1$ which satisfies:

$$d_3=d+(\lambda/2n_1)\times N_3$$

where $N_3$ is 0 or a positive integer; and $$\cos^2\Delta = \frac{\frac{n_1^2}{ns_1 ns_2}n_1^2 a^4 - n_0^2}{\left(1+\frac{n_1^2}{ns_1 ns_2}\right)(n_1^2 a^4 - n_0^2)}$$

$$\Delta = \frac{2\pi n_1 d}{\lambda}, \quad a = \left(\frac{n_1}{n_2}\right)^k \quad \text{(k is 0 or a positive integer);}$$

and forming the third film having the thickness $d_3$ determined at the step of determining the thickness $d_3$ on a surface of the second layer at the k-th pair.

The reflectivity of the reflection film in a medium having a refractive index $ns_1$ is equal to the reflectivity of the reflection film in a medium having a refractive index $ns_2$. Therefore, the optical characteristics of the optical component using this reflection film in the medium having the refractive index $ns_2$ can be predicted by measuring the optical characteristics in the medium having the refractive index $ns_1$.

According to another aspect of the present invention, there is provided a laser device comprising: a laser medium having an oscillation wavelength $\lambda$ and two reflection facets and defining an optical resonator; a lamination structure formed on at least one reflection facet of the optical resonator defined by the laser medium, the lamination structure being formed by laminating k (k is a positive integer) pairs of a first layer having a refractive index $n_1$ and a second layer having a refractive index $n_2$ wherein a thickness of the first layer is:

$$(\lambda/4+(\lambda/2)\times N_1)/n_1$$

where $N_1$ is 0 or a positive integer, and a thickness of the second layer is:

$$(\lambda/4+(\lambda/2)\times N_2)/n_2$$

where $N_2$ is 0 or a positive integer; a third layer having the refractive index $n_1$ formed on the second layer at the k-th pair of the lamination structure; and a protective member made of a material having a refractive index ns and covering a surface of the third layer, wherein if the thickness $d_3$ of the third layer is:

$$d_3=d+(\lambda/2n_1)\times N_3$$

where $N_3$ is 0 or a positive integer, then:

$$\cos^2\Delta = \frac{\frac{n_1^2}{ns}n_1^2 a^4 - n_0^2}{\left(1+\frac{n_1^2}{ns}\right)(n_1^2 a^4 - n_0^2)}$$

$$\Delta = \frac{2\pi n_1 d}{\lambda}, \quad a = \left(\frac{n_1}{n_2}\right)^k \quad \text{(k is 0 or a positive integer.)}$$

is satisfied.

The reflectivity of the reflection film in a medium having a refractive index $ns_1$ is equal to the reflectivity of the reflection film in a medium having a refractive index $ns_2$. Therefore, the optical characteristics of the laser diode in the medium having the refractive index $ns_2$ can be predicted by measuring the optical characteristics in the medium having the refractive index $ns_1$.

According to another aspect of the present invention, there is provided an optical device comprising: an optical medium having a refractive index $n_0$ and a defined reflection facet; a lamination structure formed on the reflection facet of the optical medium, the lamination structure being formed by laminating k (k is a positive integer) pairs of a first layer having a refractive index $n_1$ and a second layer having a refractive index $n_2$ wherein optical thicknesses of the first layer and the second layer relative to light having a wavelength λ are both:

$$\lambda/4+(\lambda/2)\times N$$

where N is 0 or a positive integer; a third layer having the refractive index $n_1$ and formed on the second layer at the k-th pair of the lamination structure; and a protective film made of a material having a refractive index ns and covering a surface of the third layer, wherein if the thickness $d_3$ of the third layer is:

$$d_3 = d+(\lambda/2n_1)\times N$$

where N is 0 or a positive integer, then:

$$\cos^2\Delta = \frac{\frac{n_1^2}{ns}n_1^2 a^4 - n_0^2}{\left(1+\frac{n_1^2}{ns}\right)(n_1^2 a^4 - n_0^2)}$$

$$\Delta = \frac{2\pi n_1 d}{\lambda}, \quad a = \left(\frac{n_1}{n_2}\right)^k \quad \text{(k is 0 or a positive integer.)}$$

is satisfied.

The reflectivity of the reflection film constituted of the first to third layers in the atmospheric air is generally equal to that of the reflection film covered with the protective member. Therefore, the optical characteristics of the optical device after covered with the protective member can be predicted by measuring the optical characteristics measured in the atmospheric air before covering with the protective member.

According to another aspect of the present invention, there is provided an optical device comprising: an optical medium having a refractive index $n_0$ and a defined reflection facet; a lamination structure formed on the reflection facet of the optical medium, the lamination structure being formed by laminating k (k is a positive integer) pairs of a first layer having a refractive index $n_1$ and a second layer having a refractive index $n_2$ wherein optical thicknesses of the first layer and the second layer relative to light having a wavelength λ are both:

$$\lambda/4+(\lambda/2)\times N$$

where N is 0 or a positive integer; and a third layer having the refractive index $n_1$ and formed on the second layer at the k-th pair of the lamination structure, wherein if the thickness $d_3$ of the third layer is:

$$d_3 = d+(\lambda/2n_1)\times N$$

where N is 0 or a positive integer, then:

$$\arccos\left(\sqrt{\frac{\frac{n_1^2}{16}n_1^2 a^4 - n_0^2}{\left(1+\frac{n_1^2}{16}\right)(n_1^2 a^4 - n_0^2)}}\right) \times \frac{\lambda}{2\pi n_1} \leq$$

$$d \leq \arccos\left(\sqrt{\frac{n_1^2 n_1^2 a^4 - n_0^2}{(1+n_1^2)(n_1^2 a^4 - n_0^2)}}\right) \times \frac{\lambda}{2\pi n_1}$$

or $$\arccos\left(-\sqrt{\frac{n_1^2 n_1^2 a^4 - n_0^2}{(1+n_1^2)(n_1^2 a^4 - n_0^2)}}\right) \times \frac{\lambda}{2\pi n_1} \leq$$

$$d \leq \arccos\left(-\sqrt{\frac{\frac{n_1^2}{16}n_1^2 a^4 - n_0^2}{\left(1+\frac{n_1^2}{16}\right)(n_1^2 a^4 - n_0^2)}}\right) \times \frac{\lambda}{2\pi n_1}$$

$$a = \left(\frac{n_1}{n_2}\right)^k$$

is satisfied.

A multi-layer reflection film is constituted of the first to third layers. If the thickness of the third layer is set to the above-described range, the reflectivity of the reflection film when the external medium in contact with the third layer has a first refractive index becomes equal to the reflectivity when it has a second refractive index.

According to another aspect of the present invention, there is provided a laser device comprising: a laser medium having an oscillation wavelength λ [nm], an effective refractive index $n_0$ and two reflection facets defining an optical resonator; a first layer formed on at least one reflection facet of the laser medium, made of silicone oxide and having a thickness $d_1$ [nm]; a second layer formed on a surface of the first layer, made of silicone having a refractive index $n_{si}$ and having a thickness $d_2$ [nm]; a third layer formed on a surface of the second layer, made of silicone oxide having a thickness $d_3$ [nm]; wherein the effective refractive index $n_0$ is in a range from 3.18 or larger to 3.28 or smaller, the thickness $d_1$ is in a range of:

$$(0.11-9.2\times10^{-3}R+2.2\times10^{-4}R^2)\lambda/1.45\pm15,$$

the thickness $d_2$ is in a range of:

$$(-8.7\times10^{-3}+3.5\times10^{-3}R-1.2\times10^{-5}R^2)\times(-3.6+17/n_{si})\lambda\pm15,$$

and the thickness $d_3$ is in a range of:

$$(0.23-4.9\times10^{-3}R+7.7\times10^{-5}R^2)\lambda/1.45\pm15,$$

and R [%] is in a range from 15 to 30.

According to another aspect of the present invention, there is provided a method of manufacturing a reflection film comprising the steps of: preparing an optical medium having a reflection surface and a refractive index $n_0$ in a range from 3.18 or larger to 3.28 or smaller; determining a wavelength λ of light to be reflected and a reflectivity R [%]; forming a first layer on the reflection surface of the optical medium, the first layer being made of silicone oxide and having a thickness $d_1$ [nm] which is in a range of:

$$(0.11-9.2\times10^{-3}R+2.2\times10^{-4}R^2)\lambda/1.45\pm15;$$

forming a second layer on a surface of the first layer, the second layer being made of silicone having a refractive index $n_{s1}$ and having a thickness $d_2$ [nm] which is in a range of:

$$(-8.7\times10^{-3}+3.5\times10^{-3}R-1.2\times10^{-5}R^2)\times(-3.6+17/n_{si})\lambda\pm15;$$

and forming a third layer on a surface of the second layer, the third layer being made of silicone oxide having a thickness $d_3$ [nm] which is in a range of:

$$(0.23-4.9\times10^{-3}R+7.7\times10^{-5}R^2)\lambda/1.45\pm15.$$

If the thicknesses of the first to third layers are selected so as to satisfy the above equations, a difference between the reflectivity in the atmospheric air and the reflectivity after resin sealing can be made small.

As above, even if the external medium of the reflection film is changed, a change of the reflectivity of light having a specific wavelength can be made small. If this reflection film is formed on a reflection facet of the optical resonator of a laser diode, it is possible to predict the threshold current after resin sealing at a high precision, by measuring the threshold current in the atmospheric air.

DETAILED DESCRIPTION OF THE PREFERRED EMBODIMENTS

Figure 1:
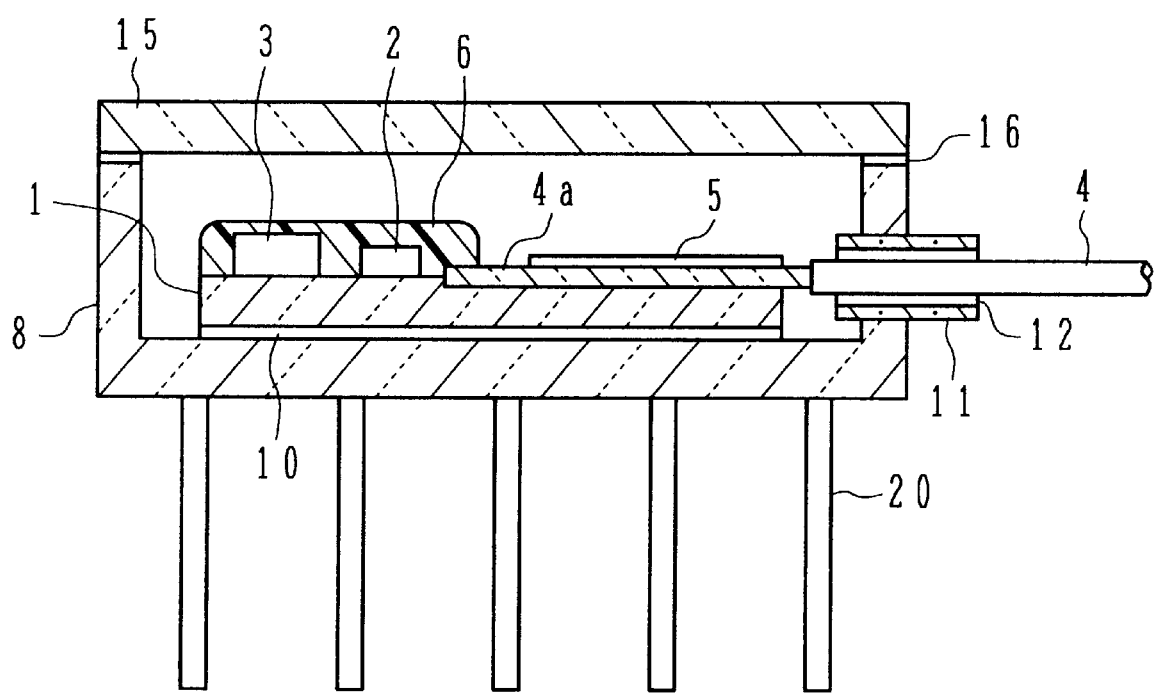
FIG. 1 is a cross sectional view of an optical semiconductor module according to a first embodiment of the invention.

FIG. 1 is the cross sectional view of an optical semiconductor module according to the first embodiment of the invention. A laser diode 2 and a photodiode 3 are fixed to wirings (not shown) formed on a support surface of a platform 1, by AuSn solder. The platform 1 is made of glass, plastic or the like transparent to ultraviolet rays. One surfaces of the laser diode 2 and photodiode 3 in contact with AuSn solder are one current terminals, and the other terminals of the laser diode 2 and photodiode 3 are connected to other wirings formed on the support surface of the platform 1.

The coating of an optical fiber 4 at the tip portion thereof is peeled off to expose an element optical fiber 4a. The element optical fiber is inserted in a groove formed in the platform 1 on the side of the support surface, and fixed by a fiber press 5. The fiber press 5 is adhered to the support surface of the platform by adhesive.

A laser beam emitted from the output facet of the laser diode 2 becomes incident upon the optical fiber 4. The end surface of the optical fiber is worked obliquely so that light reflected from the end surface of the optical fiber 4 does not reenter the laser diode 2. A laser beam leaked from the opposite facet of the laser diode 2 becomes incident upon the photodiode 3. The photodiode 3 can therefore monitor the oscillation status of the laser diode 2.

The platform 1 is fixed to the bottom surface of an outer frame 8 with the opened upper surface by a first adhesive layer 10. The optical fiber 4 extends out of the frame 8, being guided into a tubular fixing member 11 which passes through the wall of the outer frame 8. The fixing member 11 and optical fiber 4 are adhered by a second adhesive layer 12. Similar to the platform 1, the outer frame 8 and fixing member 11 are made of glass, plastic or the like transparent to ultraviolet rays.

A plurality of external leads 20 are mounted on the outside of the outer frame 8. Each outer lead 20 is continuous with an inner lead (not shown) mounted on the inside of the outer frame 8. Each wiring formed on the support surface of the platform 1 is wire-bonded to a corresponding inner lead.

The laser diode 2 and photodiode 3 are covered with a protective member 6. The protective member 6 is also formed in a laser beam transmission area from the output facet of the laser diode 1 to the tip portion of the optical fiber 4. The protective member 6 is transparent to light having a wavelength of emission light of the laser diode 2 so that optical coupling between the laser diode 2 and optical fiber 4 is not degraded.

The protective member 6 is made of acrylic modification resin of a gel ultraviolet curing type manufactured by mixing soft segment to the chemical structure of acrylic resin to soften the solid material of the acrylic resin. The acrylic resin may be acrylic poly-olefin (polyester (meta)acrylate, polyether (meta)acrylate, polyurethane (meta)acrylate, poly (meta)acrylate, or block copolymer of monomer thereof or oligomer thereof and polyester or polyether having a soft molecular structure.

Such acrylic poly-olefin resin has a reactive acryloyl group or a reactive methacryloyl group which becomes bridge bonds in the molecular structure. If ultraviolet rays are applied to such resin, an inter-molecule or intra-molecule curing reaction occurs at bridge points so that the resin becomes gel resin having a three-dimensional net structure.

Acrylic poly-olefin can be cured by radiating ultraviolet rays having a wavelength of 350 nm and an energy density of 3 to 10 J/cm$^2$, and after it is cured, it becomes gel. Curing promoting agent such as organic peroxide and amine may be mixed with resin.

The upper opening of the outer frame 8 is closed by a lid 15. The lid 15 is adhered to the outer frame 8 by a third adhesive layer 16. The first to third adhesive layers 10, 12 and 16 use ultraviolet curing adhesive.

Since gel resin is used as the material of the protective member 6, thermal stress applied to the platform 1, laser diode 2, photodiode 3 and optical fiber 4 can be relaxed. It is therefore possible to use the optical semiconductor module under an environment in a wide temperature range. Reliability of the optical semiconductor module relative to a rapid temperature change can be improved. Acrylic modification resin has a lower moisture permeability and moisture absorption than silicone resin. It is therefore possible to protect the laser diode 2 and photodiode 3 from moisture and maintain a high moisture resistance. Resin which becomes polymer gel provides a high adhesion force so that a high degree of adhesion can be obtained between the protective member 6 and the surface of the laser diode 2, photodiode 3, platform 1 and the like.

Next, a method of manufacturing the optical semiconductor module shown in FIG. 1 will be described. The laser diode 2 and photodiode 3 are adhered to the support surface of the platform 1 by AuSn solder. In this case, the position alignment in the support surface is performed by using markers formed on the support surface of the platform 1. The element optical fiber 4a of the optical fiber 4 is fitted in the groove and the optical fiber 4 is fixed by the fiber press 5.

Ultraviolet curing type adhesive is coated on the inner bottom surface of the outer frame 8 and the platform 1 is place on the inner bottom surface. The wall of the outer frame 8 on the side where the optical fiber 4 passes therethrough is constituted of the main portion of the outer frame 8 and a discrete higher wall separate from the main portion. After the platform 1 is placed on the inner bottom surface of the outer frame 8, the discrete higher wall is mounted on the main portion of the outer frame 8. The fixing member 11 is fixed and squeezed between the main portion of the outer frame 8 and the discrete higher wall. Ultraviolet curing type adhesive is filled in a space between the fixing member 11 and the optical fiber 4.

Resin composition which becomes the protective member after curing is coated covering the laser diode 2, photodiode 3, and the tip portion of the optical fiber 4 respectively mounted on the platform 1. The upper opening of the outer frame 8 is closed with the lid 15. Ultraviolet curing type adhesive is coated on the bonding surfaces of the lid 15 and outer frame 8. Ultraviolet rays are applied to the whole of the optical semiconductor module from the lower side of the outer frame 8 to thereby cure the adhesive and protective member 6.

Since ultraviolet curing type resin is used as the material of the protective member 6, it is possible to shorten a curing time more than thermosetting type resin. Ultraviolet curing type adhesive is used as the first to third adhesive layers 10, 12 and 16, and the outer frame 8, platform 1 and fixing member 11 are made of material transparent to ultraviolet rays. Therefore, by radiating ultraviolet rays from the lower side of the outer frame 8, the first to third adhesive layers 10, 12 and 16 and protective member 6 can be cured by one ultraviolet ray radiation process.

The lid 15 may be made of material transparent to ultraviolet rays to radiate ultraviolet rays from the lid 15 side.

Figure 2A:
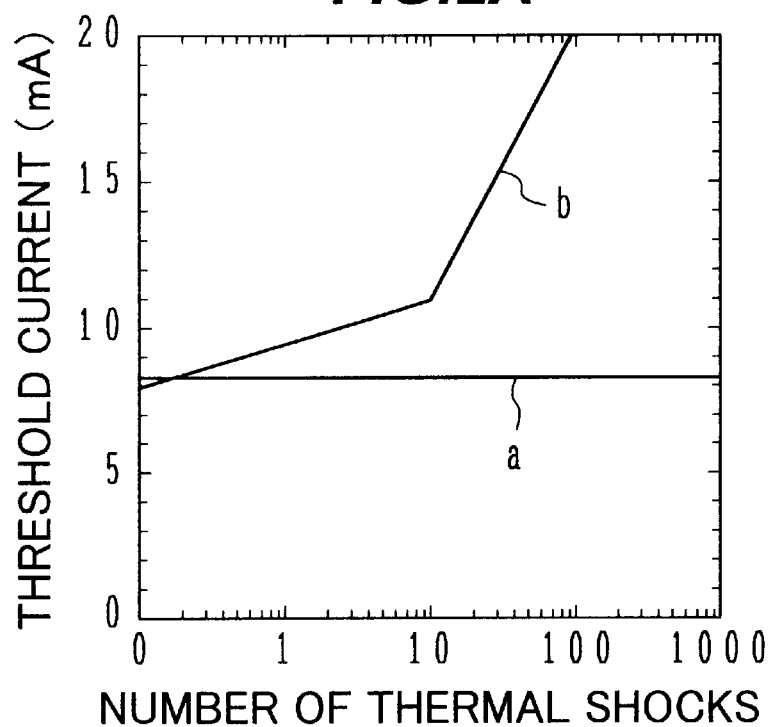
FIGS. 2A and 2B are, respectively, graphs showing the results of a thermal shock test and a high temperature, high humidity test of the optical semiconductor module shown in FIG. 1.

FIG. 2A is a graph showing the results of a thermal shock test of the optical semiconductor module shown in FIG. 1. The abscissa represents the number of thermal shocks and the ordinate represents a threshold current of the laser diode 2 in the unit of mA. A solid line a in FIG. 2A shows data of the optical semiconductor module of the embodiment, and a solid line b shows data of an optical semiconductor module having the protective member 6 shown in FIG. 1 made of epoxy resin. This test was performed by repeating a heat cycle of raising and lowering the temperature between −40° C. and 85° C. in one hour a predetermined number of times and thereafter measuring the threshold current under the condition of a temperature of 25° C.

The threshold current of the optical semiconductor module of the embodiment hardly increases even if the heat cycle is repeated. In contrast, if epoxy resin is used as the material of the protective member 6, the threshold current increases abruptly after the heat cycle is repeated about ten times. This may be ascribed to thermal stress applied to the laser diode.

Figure 2B:
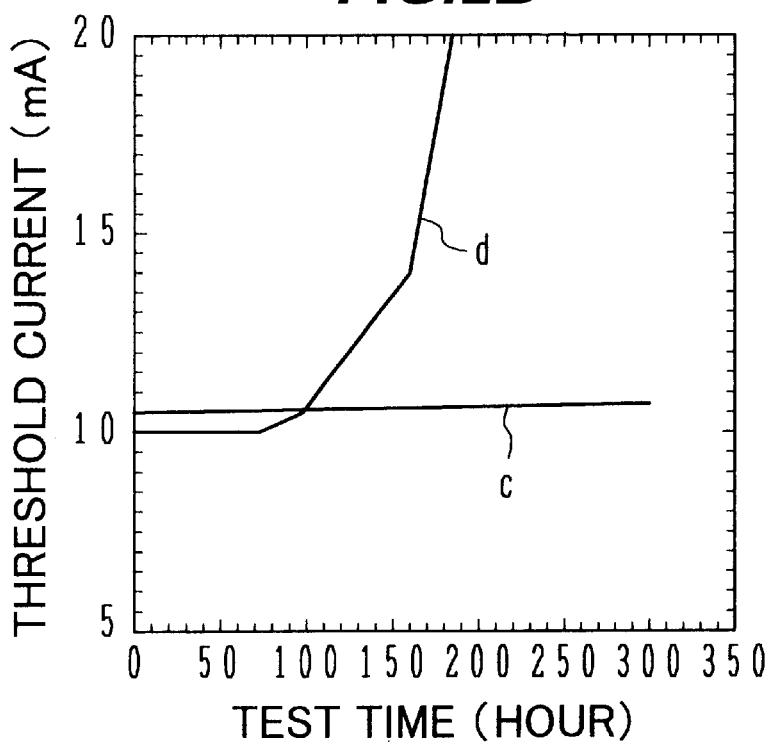

FIG. 2B is a graph showing the results of a high temperature, high humidity test of the optical semiconductor module shown in FIG. 1. The abscissa represents a test time in the unit of time (hour) and the ordinate represents a threshold current of the laser diode in the unit of mA. A solid line c in FIG. 2B shows data of the optical semiconductor module of the embodiment, and a solid line d shows data of an optical semiconductor module having the protective member 6 shown in FIG. 1 made of silicone resin. This test was performed by placing the optical semiconductor module for a predetermined time under the conditions of a temperature of 121° C., a relative humidity of 100%, a pressure of 2 atmospheric pressure, a forward constant current of 40 mA and thereafter measuring the threshold current under the condition of a temperature of 25° C.

The threshold current of the optical semiconductor module of the embodiment hardly increases even after a lapse of 300 hours. In contrast, if silicone resin is used as the material of the protective member 6, the threshold current increases abruptly after the test time exceeds 100 hours. This may be ascribed to water contents invaded to the inside of the laser diode through silicone resin.

As seen from the experiment results shown in FIGS. 2A and 2B, thermal shock resistance and moisture resistance of the optical semiconductor module can be improved by using gel acrylic modification resin as the material of the protective member 6.

Figure 3:
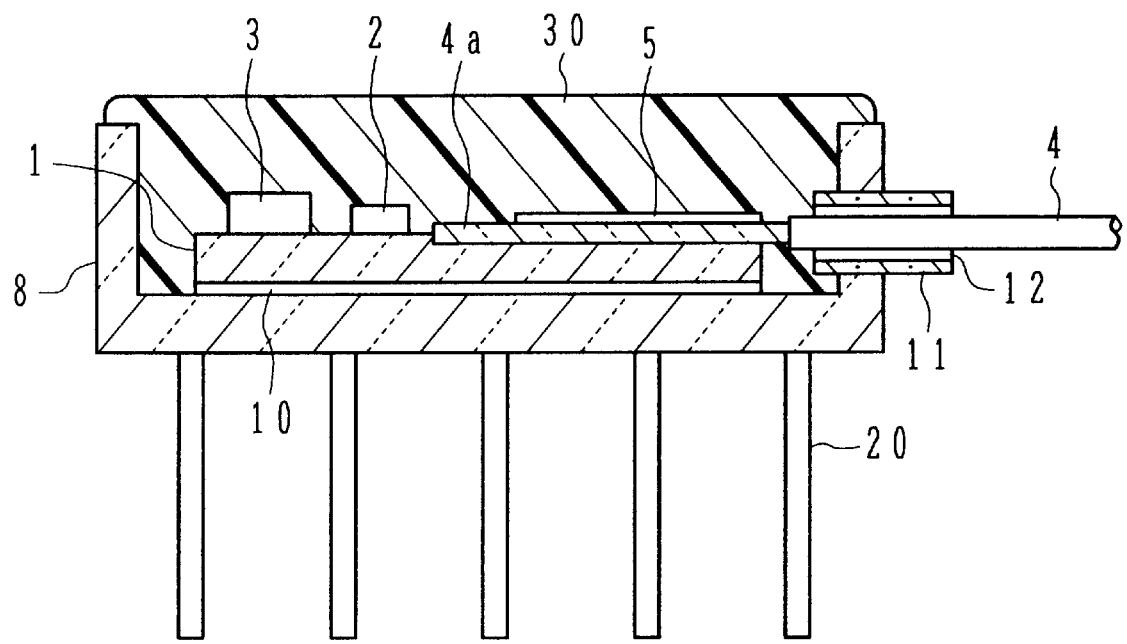
FIG. 3 is a cross sectional view of an optical semiconductor module according to a second embodiment of the invention.

FIG. 3 is a cross sectional view of an optical semiconductor module according to the second embodiment of the invention. In the first embodiment, the protective member 6 is disposed only at the peripheral areas of the laser diode 2, photodiode 3, and the tip portion of the optical fiber 4. In the second embodiment, a protective member 30 is filled in the outer frame 8, and the lid 15 of the first embodiment is not used. The other structures are the same as those of the first embodiment.

The second embodiment is also expected to have improved moisture resistance and thermal shock resistance similar to the first embodiment.

Figure 4:
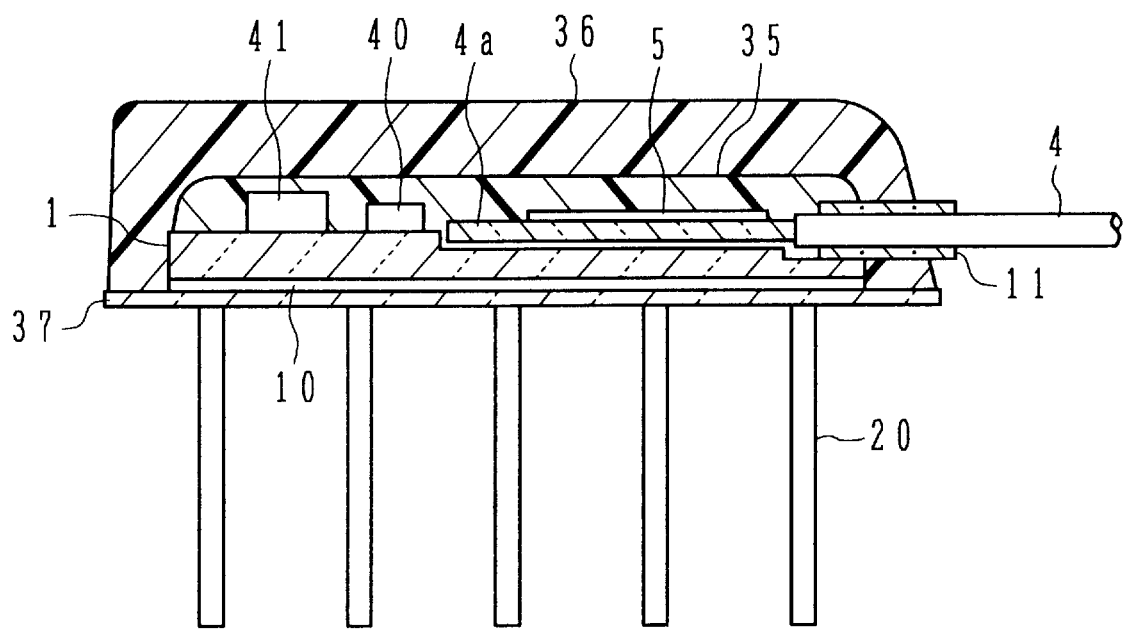
FIG. 4 is a cross sectional view of an optical semiconductor module according to a third embodiment of the invention.

Next, the third embodiment of the invention will be described with reference to FIG. 4. In the first and second embodiments, the optical semiconductor module on the transmission side has been described illustratively. In the third embodiment, an optical semiconductor module on the reception side will be described by way of example.

On the surface of a platform 1, a photodiode 40 and an electronic element 41 both of a surface mount type are mounted. These elements are fixed to the platform 1, by using AuSn solder or the like. The platform 1 is made of, for example, silicone or glass. The photodiode 40 is, for example, of a pin type using InGaAs and InP as semiconductor material. The electronic element 41 is, for example, a pre-amplifier made of a low voltage drive type silicone bipolar IC.

The element optical fiber 4a of an optical fiber is aligned in position by a V-groove formed in the surface layer of the platform 1. The element optical fiber 4a is fixed in the V-groove by a fiber press 5. The fiber press 5 is fixed to the platform 1 by ultraviolet curing type epoxy resin or acrylic resin. Light emitted from the tip of the optical fiber 4 becomes incident upon the photodiode 40 which outputs an electric signal corresponding to the incidence light. The electronic element 41 amplifies the electric signal supplied from the photodiode 40.

A portion of the optical fiber 4 crossing the boarder of the platform 1 is reinforced by a fixing member 11. For example, the fixing member 11 is made of organic material such as rubber and plastic formed by transfer mold. The V-groove is made larger near the boarder of the platform 1. The fixing member 11 is fitted in this larger V-groove portion, and the optical fiber 4 is supported on the platform 1.

The platform 1 is fixed to the upper surface of a lead frame 37 by a first adhesive layer 10. For example, the first adhesive layer 10 is made of thermosetting type epoxy resin containing silver. Silver is mixed in order to provide a high thermal conductivity and retain good thermal dissipation performance.

A plurality of outer leads 20 are disposed on the lower surface of the lead frame 37. Each outer lead is electrically connected to a corresponding one of outer terminals of the photodiode 40 and electronic element 41. For example, each of the outer terminals of the photodiode 40 and electronic element 41 is wire-bonded to a corresponding wiring formed on the surface of the platform 1. Each wiring is wire-bonded to a corresponding outer lead 20.

The protective member 35 made of insulating resin covers the photodiode 40, electronic element 41 and the element optical fiber 4a of the optical fiber 4. The protective member 35 completely fills the light transmission area between the output end of the optical semiconductor module and the photodiode 40. Similar to the protective member 6 of the first embodiment shown in FIG. 1, the protective member 35 may be made of acrylic modification resin of a gel ultraviolet curing type. The protective member 35 is transparent to the wavelength of reception light.

The surface of the protective member 35, a peripheral area of the platform 1 and a portion of the fixing member 11 are covered with a shielding member 36 made of conductive resin. The shielding member 36 is made of resin having the same composition as the protective member 35 added with conductive material to impart a conductivity. The conductive material may be silver. If the content of silver is set to 81 to 85 wt %, the conductive resin having a specific resistance of 6 to 10 $\mu\Omega$cm can be obtained. Since the portion of the fixing member 11 is covered with the protective member 35 and shielding member 36, the optical fiber 4 can be stably fixed to the lead frame 37.

Next, a method of forming the protective member 35 and shielding member 36 will be described. First, insulating resin before curing is dispensed upon the platform 1. Then, conductive resin before curing is dispensed upon the insulating resin. Thereafter, ultraviolet rays are radiated to cure the insulating and conductive resin at the same time. In this case, the conductive material may diffuse slightly near at the interface of the two types of resin before curing. However, there is no practical problem unless the conductive material reaches the element and wirings on the platform 1.

In the third embodiment, the photodiode 40 and electronic element 41 are covered with the conductive shielding member 36. Since the shielding member 36 functions as an electromagnetic shield, it is possible to prevent noises to be caused by electromagnetic interference (EMI). If noises are mixed with an input signal to the electronic element 41, noises are amplified. This shield member 36 is expected greatly particularly for an optical semiconductor module having an amplifier circuit. It is also possible to prevent abnormal oscillation of an amplifier circuit to be caused by EMI.

In the third embodiment, the protective member 35 and shielding member 36 are made of resin having the same composition. It is therefore expected that the sealing effect and electromagnetic shielding effect can be maintained stably for a long period at the high temperature and high humidity test and the heat cycle test.

A conventional electromagnetic shield has been realized by accommodating the photodiode and electronic element in a metal container. According to the third embodiment, the electromagnetic shield can by realized by using conductive resin cheaper than a metal container. Furthermore, since the insulating and conductive resin is cured by one ultraviolet ray radiation process, a sealing process and an electromagnetic shielding process can be performed at the same time. It is therefore possible to lower the cost of an optical semiconductor module.

Figure 5:
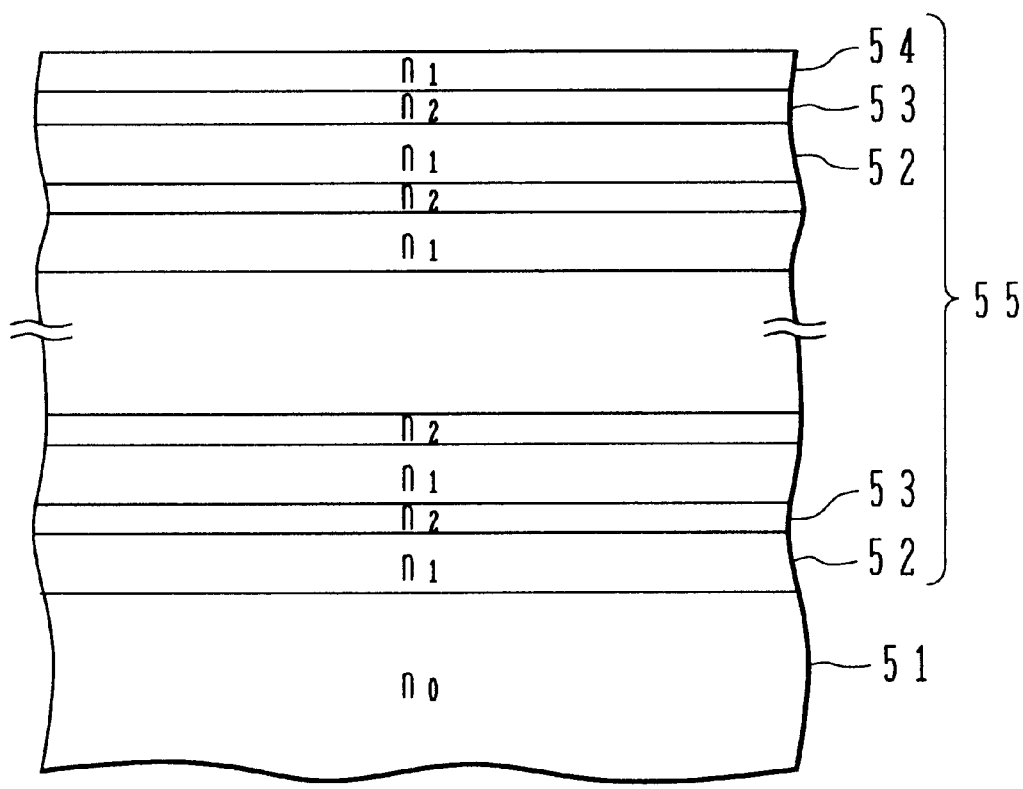
FIG. 5 is a cross sectional view of an optical device according to a fourth embodiment of the invention.

FIG. 5 is a cross sectional view of a reflection film according to the fourth embodiment of the invention. On a reflection surface of an optical medium having a refractive index $n_0$, a reflection film 55 having a lamination structure is formed. The lamination structure of the reflection film 55 is formed by laminating k pairs of a first layer 52 having a refractive index $n_1$ and a second layer 53 having a refractive index $n_2$ and forming a third layer 54 having the refractive index $n_1$ on the surface of the second layer 53 of the k-th pair. The value k is a positive integer.

The wavelength of light to be reflected is represented by $\lambda$. Then, the thickness $d_1$ of the first layer 52 is given by:

$$d_1 = (\lambda/4 + (\lambda/2) \times N_1)/n_1 \tag{A1}$$

where $N_1$ is 0 or a positive integer. The thickness $d_2$ of the second layer 53 is given by:

$$d_2 = (\lambda/4 + (\lambda/2) \times N_2)/n_2 \tag{A2}$$

where $N_2$ is 0 or a positive integer.

A method of designing the reflection film 55 having the same reflective index both at a refractive index $ns_1$ and at a refractive index $ns_2$ of an external medium (in contact with the third layer 54), will be described. The thickness $d_3$ of the third layer 54 is set so as to satisfy both equations (A3) and (A4):

$$d_3 = d + (\lambda/2n_1) \times N_3 \tag{A3}$$

where $N_3$ is 0 or a positive integer, $$\cos^2\Delta = \frac{\dfrac{n_1^2}{ns_1 ns_2} n_1^2 a^4 - n_0^2}{\left(1 + \dfrac{n_1^2}{ns_1 ns_2}\right)(n_1^2 a^4 - n_0^2)} \tag{A4}$$

$$\Delta = \frac{2\pi n_1 d}{\lambda}, \quad a = \left(\frac{n_1}{n_2}\right)^k \quad \text{(k is 0 or a positive integer.)}$$

A reflectivity R [%] of the reflection film 55 relative to light having the wavelength $\lambda$ is represented by an equation (A5):

$$R^2 = 1 - \frac{4 \times \dfrac{n_0}{ns}}{\left[\left\{1 - \left(\dfrac{n_1}{ns}\right)^2\right\}a^2 - \left\{\left(\dfrac{n_0}{n_1}\right)^2 - \left(\dfrac{n_0}{ns}\right)^2\right\}b^2\right]\cos^2\Delta + \left\{\left(\dfrac{n_1}{ns}\right)a + \left(\dfrac{n_0}{n_1}\right)b\right\}^2} \tag{A5}$$

$$\Delta = \frac{2\pi n_1 d}{\lambda}, \quad a = \left(\frac{n_1}{n_2}\right)^k, \quad b = \left(\frac{n_2}{n_1}\right)^k$$

where ns is a refractive index of the external medium in contact with the third layer 54.

If the thickness of the third layer 54 is set so as to satisfy the equation (A4), as seen from the equation (A4) the reflectivity at the refractive index $ns_1$ of the external medium becomes equal to the reflectivity at the refractive index $ns_2$.

For example, If $ns_1$ is 1 and $ns_2$ is set to the same refractive index of the external medium when the reflection film 55 is actually used, then the reflectivity of the reflection film 55 in atmospheric air or inert gas becomes equal to the reflectivity when the reflection film 55 is actually used.

Therefore, if the evaluation experiments of the reflectivity are performed in atmospheric air, the reflectivity when the reflection film 55 is actually used can be predicted at a high precision. It is difficult to form the first layer 52, second layer 53, and third layer 54 having the thicknesses equal to the ideal thicknesses calculated from the above equations. However, in practice, even if the thickness of each film is different by about ±20%, good effects can be expected. In this embodiment, the "thickness" of a thin film includes a thickness in the range of 20% from the ideal film thickness.

Figure 6:
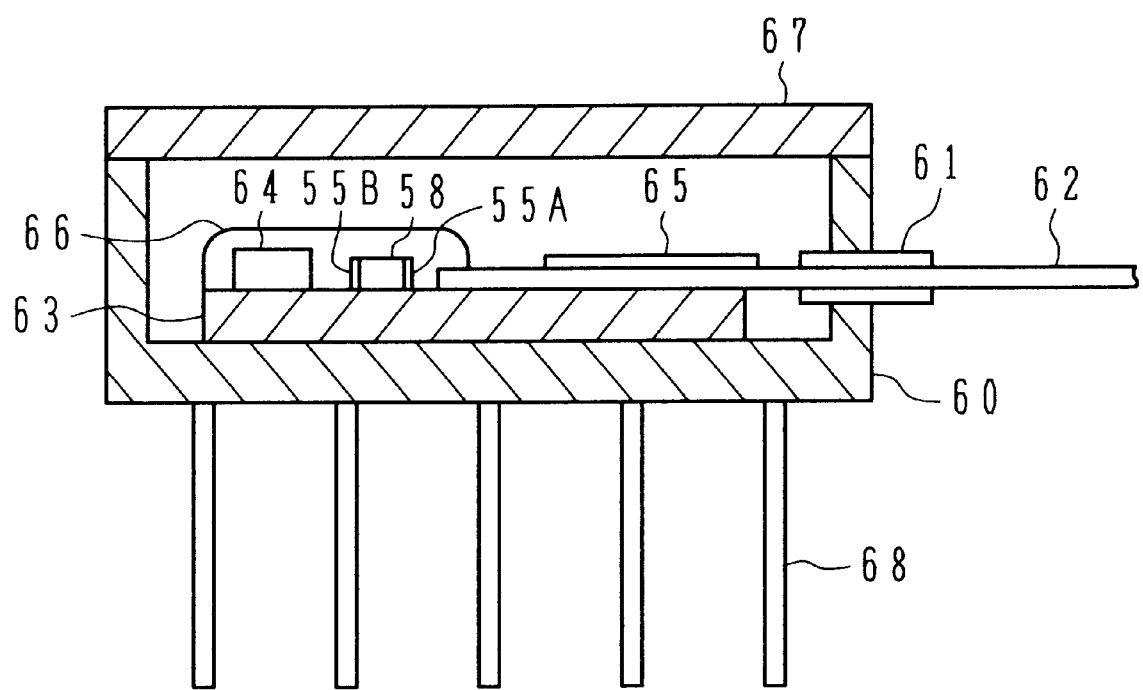
FIG. 6 is a cross sectional view of a semiconductor laser device according to a fifth embodiment of the invention.

FIG. 6 is a cross sectional view of a semiconductor laser device according to the fifth embodiment which uses the reflection film of the fourth embodiment. A platform 63 is disposed in an outer frame 60 having an upper opening. For example, the platform 63 is made of a silicon substrate. On the surface of the platform 63, a laser diode 58 and a photodiode 64 are mounted. For example, the laser diode 58 is of a Fabry-Perot type and has an oscillation wavelength of 1.3 μm using InGaAsP/InP. An equivalent refractive index $n_0$ of this optical resonator is 3.23.

Reflection films 55A and 55B of the fourth embodiments are formed on opposite facets of an optical resonator of the laser diode 58. The first layer 52 and third layer 53 shown in FIG. 5 are made of $SiO_2$ and the refractive index $n_1$ is 1.45, and the second layer 53 is made of Si and the refractive index $n_2$ is 3.8. The $SiO_2$ film and Si film may be formed by ion-assisted vapor deposition, plasma enhanced chemical vapor deposition, thermo chemical vapor deposition or sputtering.

A laser beam transmitted through the reflection film and radiated backward becomes incident upon the photodiode 64. By measuring an output signal from the photodiode 64, the oscillation state of the laser diode can be monitored.

A fraction of the laser beam transmitted through the reflection film 55A and radiated forward becomes incident upon an optical fiber 62. The optical fiber 62 is placed on the surface of the platform 63 and fixed in position by a fiber press 65. The optical fiber 62 extends out of the outer frame 60, passing through the side wall of the outer frame 60. The portion of the optical fiber 62 passing through the outer frame 60 is protected by a holder 61.

Sealing resin 66 covers the photodiode 64, laser diode 58 and the tip portion of the optical fiber 62. For example, the sealing resin is silicone resin. The refractive index of silicone resin is 1.38. The upper opening of the outer frame 60 is closed by a lid 67. A plurality of signal input/output terminals 68 are mounted on the bottom of the outer frame 60.

From the equations (A1) and (A2), the thickness $d_1$ of the first layer 52 shown in FIG. 5 is 224 nm and the thickness $d_2$ of the second layer 53 is 86 nm. It was assumed $N_1=N_2=0$. By entering $ns_1=1$ and $ns_2=1.38$ into the equation (A4), it becomes $\cos^2 \Delta=0.395$. For example, therefore, the thickness $d_3$ of the third layer 54 is 127 nm. From the equation (A5), the reflectivity R [%] is 76.7%.

Figure 7:
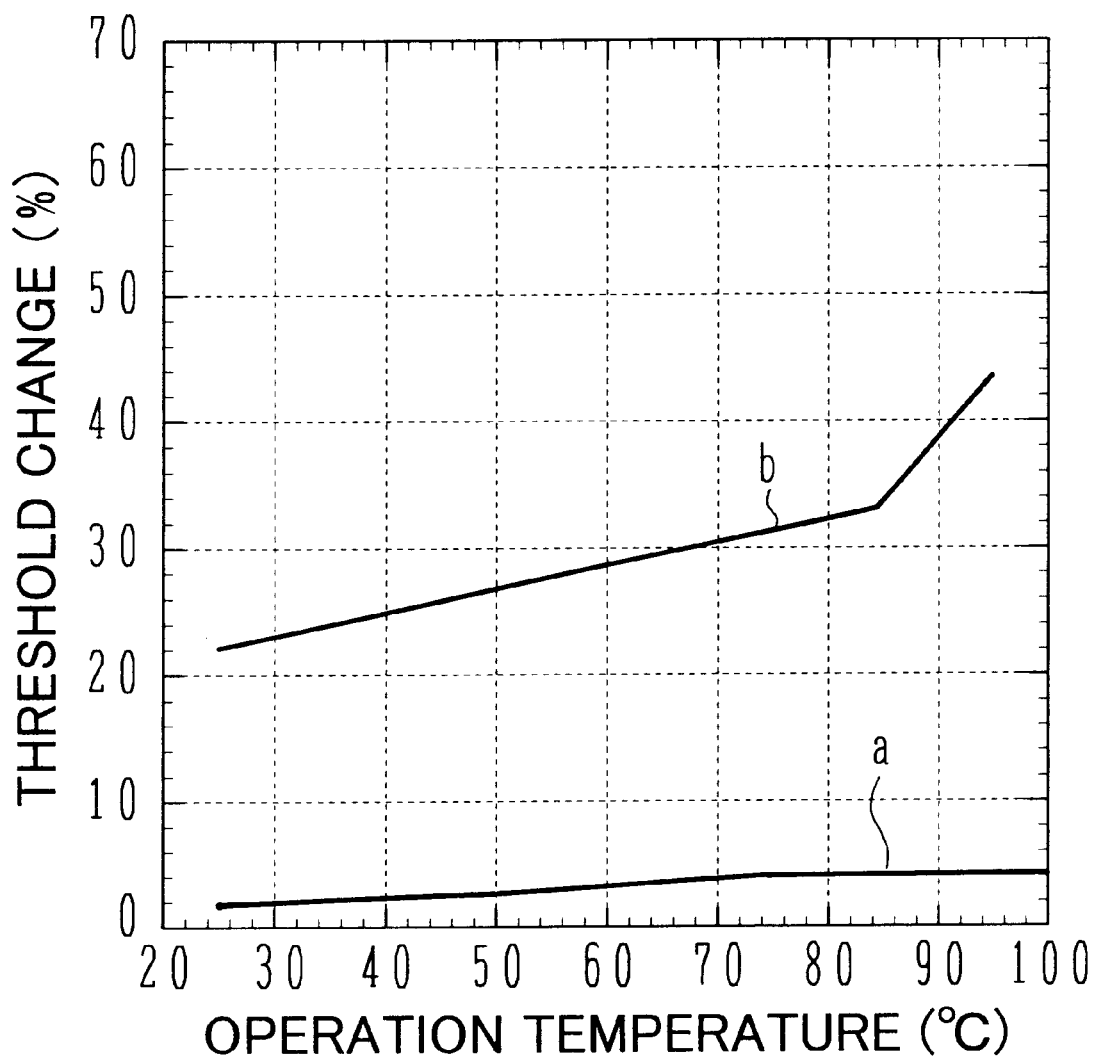
FIG. 7 is a graph showing the temperature characteristics of a change in the threshold current before and after resin sealing of semiconductor laser devices of the fifth embodiment and a comparative example.

FIG. 7 is a graph showing as a function of an operation temperature a change in the threshold current before and after resin sealing of the laser diode of the fifth embodiment. The abscissa represents an operation temperature by the unit of ° C. and the ordinate represents a change in the threshold current before and after silicone resin sealing in the unit of %. A solid line a in this graph indicates a change in the threshold current of the laser diode of the second embodiment, a solid line b indicates a change in the threshold current of a laser diode using the reflection film without the third layer 54 shown in FIG. 5.

The change in the threshold current is 5% or smaller if the reflection film of the fourth embodiment is used. In contrast, the change in the threshold current is about 20 to 45% if the third layer is not formed. As seen from this graph, the change in the threshold current before and after resin sealing can be made small by using the reflection film of the fourth embodiment. This effects are particularly large when the operation temperature is high.

This is because the reflectivity of the reflection film of the fourth embodiment in the atmospheric air is generally the same as the reflectivity after resin sealing. If the third layer 54 shown in FIG. 5 is not used, the reflectivity in the atmospheric air is different from that after resin sealing so that the threshold current changes greatly before and after resin sealing. By using the reflection film of the fourth embodiment, it is possible to predict the threshold current after resin sealing at a high precision by evaluating the threshold current of the laser diode in the atmospheric air.

In the fifth embodiment, $SiO_2$ and Si are used as the materials of the first and second layers 52 and 53 shown in FIG. 5. Other materials may also be used such as oxide, nitride or fluoride of Al, Si, Ti, Zn, Mg or Li. When the reflection film is formed on the facet of an optical resonator of the laser diode, it is preferable that the first layer in direct contact with the facet is made of insulating material.

In the fifth embodiment, a Fabry-Perot type laser has been described illustratively. The reflection film of the fourth embodiment is also applicable to other laser diodes such as a distribution feedback type laser diode and a distribution Bragg reflection type later diode.

The refractive index of usual material is 1 or higher so that the $ns_1$ and $ns_2$ of the equation (A4) are 1 or higher. The refractive index of reflection film material usable in an oscillation wavelength range of a laser diode is generally 4 or smaller. Therefore, it is generally considered that the following condition is satisfied:

$$1 \leq (ns_1 \times ns_2) \leq 16.$$

From this condition and the equation (A4), the following formula are obtained:

$$\arccos\left(\sqrt{\frac{\frac{n_1^2}{16}n_1^2 a^4 - n_0^2}{\left(1 + \frac{n_1^2}{16}\right)(n_1^2 a^4 - n_0^2)}}\right) \times \frac{\lambda}{2\pi n_1} \leq \quad (A6)$$

$$d \leq \arccos\left(\sqrt{\frac{n_1^2 n_1^2 a^4 - n_0^2}{(1 + n_1^2)(n_1^2 a^4 - n_0^2)}}\right) \times \frac{\lambda}{2\pi n_1},$$

and $$\arccos\left(-\sqrt{\frac{n_1^2 n_1^2 a^4 - n_0^2}{(1 + n_1^2)(n_1^2 a^4 - n_0^2)}}\right) \times \frac{\lambda}{2\pi n_1} \leq \quad (A7)$$

$$d \leq \arccos\left(-\sqrt{\frac{\frac{n_1^2}{16}n_1^2 a^4 - n_0^2}{\left(1 + \frac{n_1^2}{16}\right)(n_1^2 a^4 - n_0^2)}}\right) \times \frac{\lambda}{2\pi n_1}.$$

$$a = \left(\frac{n_1}{n_2}\right)^k$$

Namely, the thickness $d_3$ of the third layer 54 shown in FIG. 5 is required to satisfy the equation (A3) and the formula (A6) and (A7). For example, if k=1, $n_0$=3.23, $n_1$=1.45 and $n_2$=3.8, then:

$$49\ nm \leq d \leq 138\ nm\ or\ 311\ nm \leq d \leq 411.$$

In the fifth embodiment, the reflection film is formed on the reflection facet of the laser diode. The reflection film of the fourth embodiment may be formed on a reflection surface of an optical medium having the refractive index $ns_1$ other than the laser diode. In this case, the reflection film is covered with an optical medium having the refractive index $ns_2$. If the reflection film is used for a laser diode, the oscillation wavelength of the laser diode corresponds to the wavelength of light to be reflected by the reflection film. If the reflection film is formed on a reflection facet of an optical medium, the wavelength of light to be reflected by the reflection film can be specified by the following method.

The optical film thickness of the first layer 52 and second layer 53 shown in FIG. 5 is both given by:

$$\lambda/4 + (\lambda/2) \times N \quad (A8)$$

where N is 0 or a positive integer. The optical film thickness is a thickness obtained by multiplying the actual film thickness by the refractive index of the film. The optical film thickness is obtained by measuring the film thicknesses of the first layer 52 and second layer 53 constituting the reflection film and multiplying them by the refraction indices. The wavelength λ relative to the optical film thicknesses of the first and second layers is specified by changing N in the equation (A8). In this case, N of the first layer is not necessarily required to be equal to N of the second layer.

After the wavelength of light to be reflected is specified, a preferred thickness $d_3$ of the third layer 54 shown in FIG. 5 can be obtained from the equations (A3) and (A4) into which $ns_1$=1 is substituted. The reflection film formed in this manner has the same reflectivity both at a refractive index of 1, e.g., in the atmospheric air and at a refractive index $ns_2$ in a medium. Therefore, it is possible to predict the reflectivity in the medium having the refractive index $ns_2$ at a high precision by evaluating the reflectivity in the atmospheric air.

Next, the structure of an optical device according to the sixth embodiment will be described. The reflection film of the fourth embodiment has basically a film having a thickness of a quarter wavelength of target light, in the lamination structure. In the sixth embodiment, the reflection film has a three-layer structure and the thickness of each film is determined departing from the quarter wavelength standard.

Figure 8:
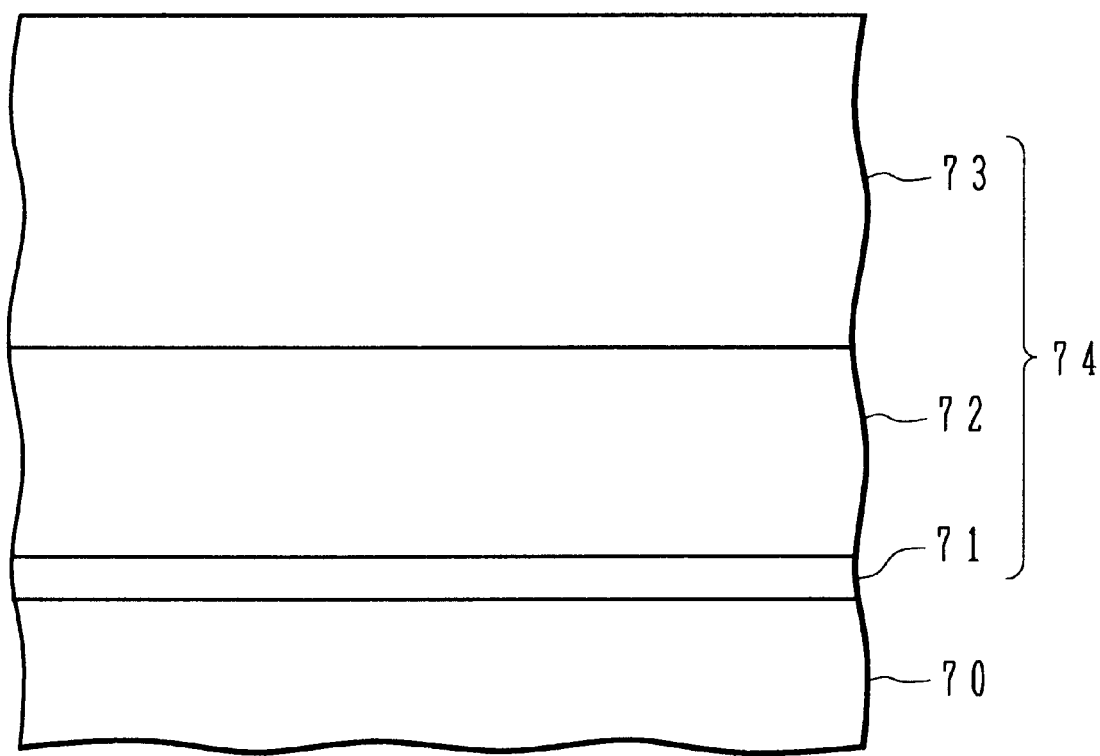
FIG. 8 is a cross sectional view of an optical device according to a sixth embodiment of the invention.

FIG. 8 is a cross sectional view of an optical device of the sixth embodiment. On the surface of an optical medium 70, a first layer 71, a second layer 72, and a third layer 73 are laminated. These three layers of first to third layers 71 to 73 form a reflection film 74. The optical medium 70 is a laser diode having an equivalent refractive index of 3.23 and an oscillation wavelength of 1.31 μm. The first layer 71 and third layer 73 are made of $SiO_2$ having a refractive index of 1.45 and the second layer 72 is made of silicone having a refractive index of 3.8.

By changing the thicknesses of the first to third layers 71 to 73, reflectivities of the reflection film 74 having the three-layer structure at the wavelength of 1.31 μm in the atmospheric air and at nearby wavelengths and reflectivities of the reflection film 74 coated with resin having a refractive index of 1.38 were obtained through computation.

Figure 9:
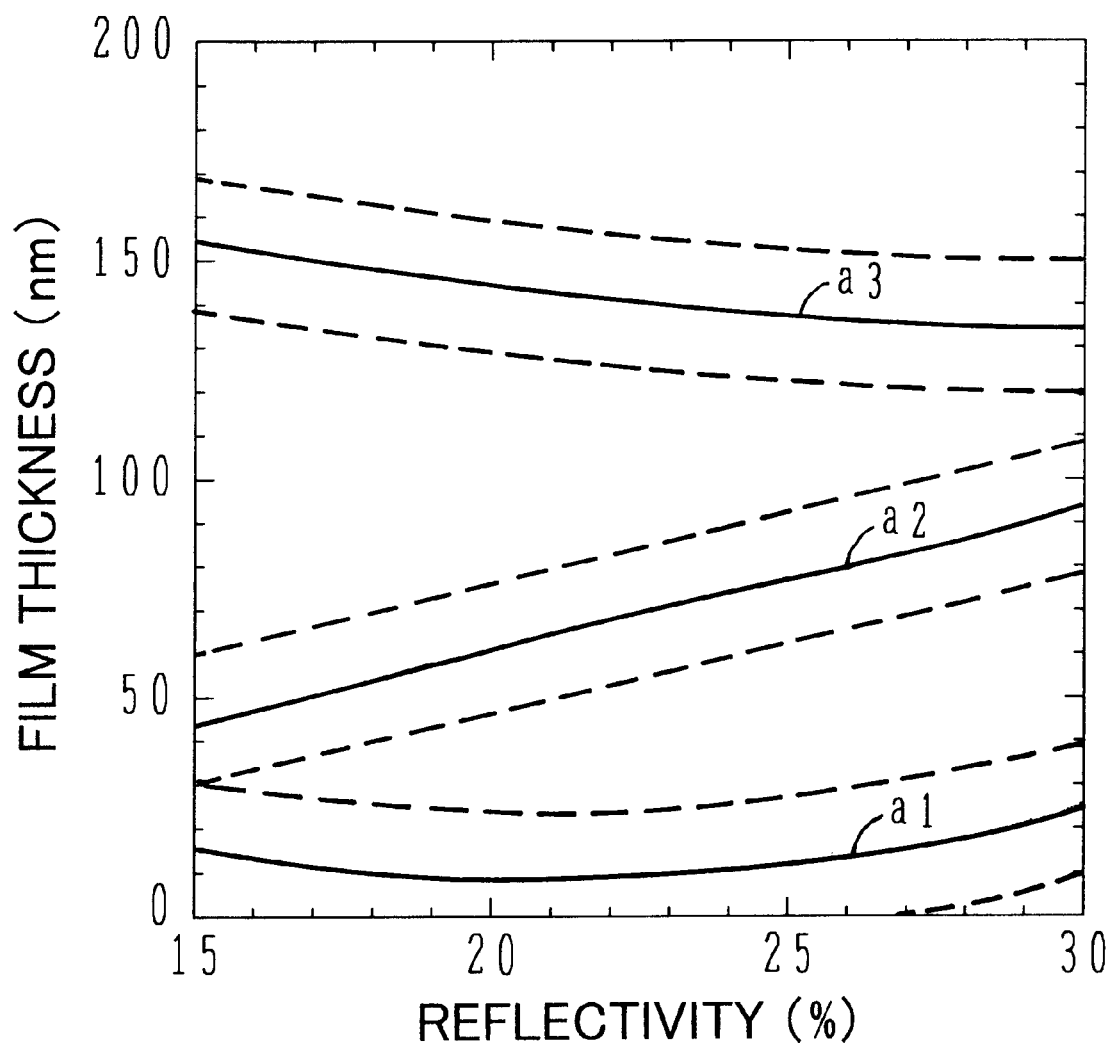
FIG. 9 is a graph showing the thickness of a multi-layer film used as a reflection film of the optical device of the sixth embodiment.

FIG. 9 is a graph showing, as a function of the reflectivity R [%], combinations of film thicknesses which satisfy the condition that the reflectivity of the reflection film placed in the atmospheric air is generally equal to that of the reflection film sealed with resin and the condition that a change in the reflectivity to be caused by a change in the wavelength of light to be reflected is relatively small. The abscissa represents a reflectivity R in the unit of % and the ordinate represents a film thickness in the unit of nm. Solid lines a1, a2 and a3 in this graph show the film thicknesses of the first, second and third layers 71, 72 and 73.

A reflectivity at an interface between a cleaved surface of a laser diode and air is generally about 30%. The reflection film used by a laser diode is usually set smaller than the reflectivity at the interface between the cleaved surface and air. From this reason, the upper limit of the reflectivity shown in FIG. 9 is set to 30%. Desired solutions were not obtained in an area having the reflectivity of 15% or lower. It is therefore preferable to set the design value of the reflectivity of the reflection film having the three-layer structure to 15% or higher. From this reason, the lower limit of the reflectivity shown in FIG. 9 is set to 15%.

The thickness $d_1$ (curve a1) of the first layer 71 approximated by a second order equation of the reflectivity R [%] is given by:

$$d_1 = (0.11 - 9.2 \times 10^{-3} R + 2.2 \times 10^{-4} R^2) \lambda_0 / n_1 \quad (A9)$$

where $\lambda_0$ represents a target light wavelength of 1.31 μm and $n_1$ is the refractive index of 1.45 of the first layer 71. Since the thickness $d_1$ is considered generally proportional to the wavelength $\lambda_0$, the thickness $d_1$ is expressed by a first order equation of the wavelength $\lambda_0$.

Similarly, the thickness $d_2$ (curve a2) of the second layer 72 is given by:

$$d_2 = (-8.7 \times 10^{-3} + 3.5 \times 10^{-3} R - 1.2 \times 10^{-5} R^2) \times (-3.6 + 17/n_2) \lambda_0 \quad (A10)$$

where $n_2$ is the refractive index of 3.8 of the second layer 72. The term of $(-3.6 + 17/n_2)$ is a term derived from the graph similar to FIG. 9 obtained by changing the refractive index $n_2$ from 3.6 to 3.85.

In practice, the refractive index of a silicone film formed by plasma enhanced chemical vapor deposition, sputtering or the like changes in this range of 3.6 to 3.85, depending upon variations of the film forming conditions. It is therefore preferable to determine the thickness of the second layer 72 by substituting the refractive index $n_2$ matching the actual film forming conditions into the equation (A10).

The thickness $d_3$ (curve a3) of the third layer 73 is approximated by:

$$d_3 = (0.23 - 4.9 \times 10^{-3} R + 7.7 \times 10^{-5} R^2) \lambda_0 / n_3 \quad (A11)$$

where $n_3$ is the refractive index of 1.45 of the third layer 73.

According to the calculation results, if each of the thicknesses $d_1$ to $d_3$ is increased or decreased in a range of ±15 nm (a range between broken lines in FIG. 9) from the value calculated by the equations (A9) to (A11), the reflectivity changes in a range of ±3%. For example, if the thickness is to be set so as to have a reflectivity of 25% and the thickness is changed by about 15 nm, the reflectivity changes in a range of 22% to 28%. This change in the reflectivity is in an allowable range.

Also according to the calculation results, if each of the thicknesses $d_1$ to $d_3$ is increased or decreased in a range of about ±15 nm from the target value, a difference between the reflectivity of the reflection film of the laser diode placed in the atmospheric air and the reflectivity of the reflection film sealed with resin is about 2% at the maximum. This difference becomes 10% if a single-layer reflection film is used. Namely, even if each of the thicknesses $d_1$ to $d_3$ is increased or decreased in a range of about ±15 nm, the effect of making small the difference between the reflectivity in the atmospheric air and that after resin sealing can be expected sufficiently. For example, the preferred film thicknesses $d_1$, $d_2$ and $d_3$ for the reflectivity of 26% are 28.2 nm or thinner, 66.2 to 96.7 nm, and 121.2 to 151.2 nm, respectively.

If the thickness of the first layer 71 is thinned by 15 nm from the target value, the thickness $d_1$ may be 0 nm in some cases. However, the first layer 71 is actually formed and the thickness $d_1$ does not become 0 nm in practical cases and becomes thicker than 0 nm. In practice, the thickness $d_1$ becomes 2 nm or more at the minimum.

In the sixth embodiment, as seen from FIG. 9, the range allowed to the thickness $d_1$ of the first layer 71 is 40 nm or thinner. Since each of a multi-layer reflection film of the fourth embodiment is determined from the quarter wavelength standard, the thickness of each layer of the reflection film used by a general laser diode is 220 nm or thicker. A thickness of 40 nm or thinner of the first layer in contact with an optical medium is a significant feature of the sixth embodiment.

In the sixth embodiment, the effective refractive index of the optical medium is set to 3.23. If the effective refractive index of the optical medium is in a range of 3.23±0.05, the preferable thicknesses can be approximated from the equations (A9) to (A11).

In the sixth embodiment, the first layer 71 in contact with the optical medium is made of $SiO_2$, the second layer 72 on the first layer 71 is made of silicone, and the third layer 73 is made of $SiO_2$. Combinations of preferable thicknesses for other materials were also computed. The combinations of thicknesses of the reflection film of the optical device according to first to third modifications of the sixth embodiment will be described. The refractive index of the optical medium used by the first to third modifications is the same as that of the six embodiment.

First, the first modification of the sixth embodiment will be described. In the first modification, the first layer 71 and third layer 73 shown in FIG. 8 are made of aluminum oxide, and the second layer 72 is made of silicone. The refraction indices $n_1$ and $n_3$ of the first and third layers are 1.72.

The preferred thicknesses $d_1$, $d_2$ and $d_3$ of the first, second and third layers 71, 72 and 73 are given by:

$$d_1 = (1.7 \times 10^{-3} + 1.1 \times 10^{-3} R + 3.1 \times 10^{-5} R^2) \lambda_0 / n_1$$

$$d_2 = (2.3 \times 10^{-2} + 3.5 \times 10^{-3} R - 5.6 \times 10^{-5} R^2) \times (-1.4 + 8.9/n_2) \lambda_0$$

$$d_3 = (0.21 - 1.9 \times 10^{-3} R + 2.1 \times 10^{-5} R^2) \lambda_0 / n_3.$$

The allowable range of each thickness is ±15 nm of each of the target thicknesses $d_1$ to $d_3$ calculated from the above equations. The upper limit of the thickness of the first layer is 60 nm. For example, the preferred film thicknesses $d_1$, $d_2$ and $d_3$ for the reflectivity of 26% are 23.8 to 53.8 nm, 75.8 to 105.8 nm, and 117.5 to 147.5 nm, respectively.

Next, the second modification of the sixth embodiment will be described. In the second modification, the first layer 71 shown in FIG. 8 is made of silicone oxide, the second layer 72 is made of silicone, and the third layer 73 is made of aluminum oxide. Namely, $n_1$=1.45, $n_2$=3.6 to 3.85, and $n_3$=1.72.

The preferred thicknesses $d_1$, $d_2$ and $d_3$ of the first, second and third layers 71, 72 and 73 are given by:

$$d_1 = (-3.1 \times 10^{-5} + 3.6 \times 10^{-3} R - 3.5 \times 10^{-5} R^2) \lambda_0 / n_1$$

$$d_2 = (3.5 \times 10^{-2} + 2.5 \times 10^{-3} R - 3.6 \times 10^{-5} R^2) \times (-2.6 + 1.4/n_2) \lambda_0$$

$$d_3 = (0.21 - 1.9 \times 10^{-3} R + 2.1 \times 10^{-5} R^2) \lambda_0 / n_3.$$

The allowable range of each thickness is ±15 nm of each of the target thicknesses $d_1$ to $d_3$ calculated from the above equations. The upper limit of the thickness of the first layer is 40 nm. For example, the preferred film thicknesses $d_1$, $d_2$ and $d_3$ for the reflectivity of 26% are 20.4 to 50.4 nm, 73.4 to 103.4 nm, and 117.5 to 147.5 nm, respectively.

Next, the third modification of the sixth embodiment will be described. In the third modification, the first layer 71 shown in FIG. 8 is made of aluminum oxide, the second layer 72 is made of silicone, and the third layer 73 is made of silicone oxide. Namely, $n_1$=1.72, $n_2$=3.6 to 3.85, and $n_3$=1.45.

The preferred thicknesses $d_1$, $d_2$ and $d_3$ of the first, second and third layers 71, 72 and 73 are given by:

$$d_1 = (0.12 - 1.2 \times 10^{-2} R + 3.2 \times 10^{-4} R^2) \lambda_0 / n_1$$

$$d_2 = (-2.7 \times 10^{-2} + 3.4 \times 10^{-3} R + 2.4 \times 10^{-5} R^2) \times (-3.8 + 2.8/n_2) \lambda_0$$

$$d_3 = (0.23 - 4.9 \times 10^{-3} R + 7.7 \times 10^{-5} R^2) \lambda_0 / n_3.$$

The allowable range of each thickness is ±15 nm of each of the target thicknesses $d_1$ to $d_3$ calculated from the above equations. The upper limit of the thickness of the first layer is 50 nm. For example, the preferred film thicknesses $d_1$, $d_2$ and $d_3$ for the reflectivity of 26% are 0.9 to 30.9 nm, 69.6 to 99.6 nm, and 121.2 to 151.2 nm, respectively.

As described above, as the combination of materials of the first to third layers is changed, the preferred thickness of each layer changes. By forming a graph similar to FIG. 9 for each combination of materials, it is possible to form a three-layer reflection film having a small difference of reflectivities before and after resin sealing.

Figure 10:
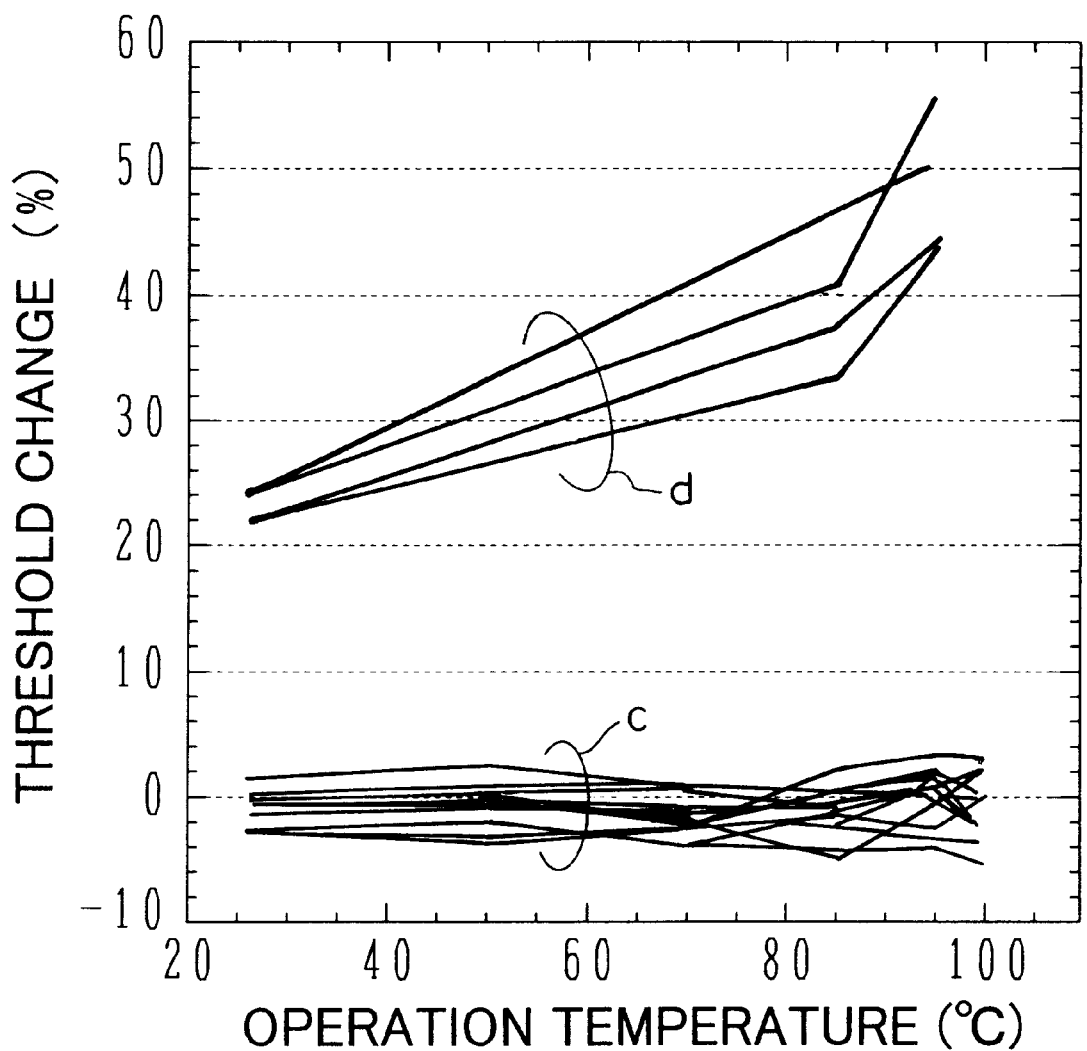
FIG. 10 is a graph showing the temperature characteristics of a change in the threshold current before and after resin sealing of semiconductor laser devices of the sixth embodiment and a comparative example.

FIG. 10 is a graph showing a change in the threshold current before and after resin sealing of the reflection film of the sixth embodiment (including the first to third modifications) in the laser diode shown in FIG. 6, the change being represented by a ratio of the threshold current after the resin sealing to that before the resin sealing.

A polygonal line group c shown in FIG. 10 indicates the change in the threshold current when the three-layer reflection film of the sixth embodiment is used, and a polygonal line group d indicates the change in the threshold current when a conventional single layer reflection film is used. In the case of the conventional reflection film, the threshold current increases by 20% or more by using resin sealing. In contrast, the change in the threshold current is ±5% or smaller when the three-layer reflection film of the sixth embodiment is used. By using the three-layer reflection film of the sixth embodiment, a change in the threshold current to be caused by resin sealing can be suppressed.

The present invention has been described in connection with the preferred embodiments. The invention is not limited only to the above embodiments. It is apparent that various modifications, improvements, combinations, and the like can be made by those skilled in the art.

What is claimed is:

1. An optical semiconductor module comprising:
   a platform having a support surface;
   an optical semiconductor element disposed on the support surface of said platform;
   an optical element disposed on the support surface of said platform and having an optical coupling facet, said optical element being optically coupled to said optical semiconductor element at the optical coupling facet; and
   a protective member made of gel acrylic modification resin, covering said optical semiconductor element, and being disposed at least in a light transmission area in a space between said semiconductor element and the optical coupling facet of said optical element.

2. An optical semiconductor module according to claim 1, wherein said protective member is made of ultraviolet curing type resin.

3. An optical semiconductor module according to claim 1, wherein said optical element is an optical fiber.

4. An optical semiconductor module according to claim 3, further comprising:

an outer frame having an opening, said platform being accommodated in said outer frame, and the optical fiber being extending out of said outer frame by being passed through a wall of said outer frame; and a first adhesive layer for adhering said platform to said outer frame, wherein said first adhesive layer is made of ultraviolet curing type resin.

5. An optical semiconductor module according to claim 4, further comprising a second adhesive layer made of ultraviolet curing type resin for adhering the optical fiber to the wall of said outer frame through which the optical fiber passes.

6. An optical semiconductor module according to claim 5, wherein said platform and said outer frame are transparent to ultraviolet rays for curing the ultraviolet curing type resin contained in said protective member and said first and second adhesive layers.

7. An optical semiconductor module according to claim 4, further comprising:

a lid for closing the opening of said outer frame; and a third adhesive layer made of ultraviolet curing type resin for adhering said lid to said outer frame.

8. An optical semiconductor module according to claim 7, wherein said lid is transparent to ultraviolet rays.

9. An optical semiconductor module according to claim 4, wherein said protective member is filled in said outer frame.

10. An optical semiconductor module comprising:

a platform having a support surface;

an optical semiconductor element disposed on the support surface of said platform;

an optical element disposed on the support surface of said platform and having an optical coupling facet, said optical element being optically coupled to said optical semiconductor element at the optical coupling facet;

a protective member made of insulating resin covering said optical semiconductor element, and being disposed at least in a light transmission area in a space between said semiconductor element and the optical coupling facet of said optical element; and a shielding member made of conductive resin and covering a surface of said protective member.

11. An optical semiconductor module according to claim 10, wherein said shielding member is made of base resin having a same composition as the insulating resin of said protecting member and mixed with conductive material.

12. An optical semiconductor module according to claim 10, wherein said optical semiconductor element is a photo-electric conversion element for converting an optical signal into an electric signal, the optical semiconductor module further comprises an electronic element for amplifying the electric signal output from said optical semiconductor element, said electronic element being disposed on said platform, and said protective member covering said electronic element.

13. A laser device comprising:

a laser medium having an oscillation wavelength $\lambda$ and two reflection facets and defining an optical resonator;

a lamination structure formed on at least one reflection facet of the optical resonator defined by said laser medium, said lamination structure being formed by laminating k (k is a positive integer) pairs of a first layer having a refractive index $n_1$ and a second layer having a refractive index $n_2$ wherein a thickness of the first layer is:

$$(\lambda/4 + (\lambda/2) \times N_1)/n_1$$

where $N_1$ is 0 or a positive integer, and a thickness of the second layer is:

$$(\lambda/4 + (\lambda/2) \times N_2)/n_2$$

where $N_2$ is 0 or a positive integer;

a third layer having the refractive index $n_1$ formed on the second layer at the k-th pair of said lamination structure; and a protective member made of a material having a refractive index ns and covering a surface of said third layer, wherein if the thickness $d_3$ of said third layer is:

$$d_3 = d + (\lambda/2n_1) \times N_3$$

where $N_3$ is 0 or a positive integer, then:

$$\cos^2 \Delta = \frac{\frac{n_1^2}{ns} n_1^2 a^4 - n_0^2}{\left(1 + \frac{n_1^2}{ns}\right)(n_1^2 a^4 - n_0^2)}$$

$$\Delta = \frac{2\pi n_1 d}{\lambda}, \quad a = \left(\frac{n_1}{n_2}\right)^k \quad \text{(k is 0 or a positive integer.)}$$

is satisfied.

14. An optical device comprising:

an optical medium having a refractive index $n_0$ and a defined reflection facet;

a lamination structure formed on the reflection facet of said optical medium, said lamination structure being formed by laminating k (k is a positive integer) pairs of a first layer having a refractive index $n_1$ and a second layer having a refractive index $n_2$ wherein optical thicknesses of the first layer and the second layer relative to light having a wavelength $\lambda$ are both:

$$\lambda/4 + (\lambda/2) \times N$$

where N is 0 or a positive integer;

a third layer having the refractive index $n_1$ and formed on the second layer at the k-th pair of said lamination structure; and a protective film made of a material having a refractive index ns and covering a surface of said third layer, wherein if the thickness $d_3$ of said third layer is:

$$d_3 = d + (\lambda/2n_1) \times N$$

where N is 0 or a positive integer, then:

$$\cos^2\Delta = \frac{\frac{n_1^2}{ns}n_1^2 a^4 - n_0^2}{\left(1+\frac{n_1^2}{ns}\right)(n_1^2 a^4 - n_0^2)}$$

$$\Delta = \frac{2\pi n_1 d}{\lambda}, \quad a = \left(\frac{n_1}{n_2}\right)^k \quad \text{(k is 0 or a positive integer.)}$$

is satisfied.

15. An optical device comprising:
an optical medium having a refractive index $n_0$ and a defined reflection facet;
a lamination structure formed on the reflection facet of said optical medium, said lamination structure being formed by laminating k (k is a positive integer) pairs of a first layer having a refractive index $n_1$ and a second layer having a refractive index $n_2$ wherein optical thicknesses of the first layer and the second layer relative to light having a wavelength $\lambda$ are both:

$$\lambda/4+(\lambda/2)\times N$$

where N is 0 or a positive integer; and
a third layer having the refractive index $n_1$ and formed on the second layer at the k-th pair of said lamination structure,
wherein if the thickness $d_3$ of said third layer is:

$$d_3=d+(\lambda/2n_1)\times N$$

where N is 0 or a positive integer, then:

$$\arccos\left(\sqrt{\frac{\frac{n_1^2}{16}n_1^2 a^4 - n_0^2}{\left(1+\frac{n_1^2}{16}\right)(n_1^2 a^4 - n_0^2)}}\right)\times\frac{\lambda}{2\pi n_1} \le$$

$$d \le \arccos\left(\sqrt{\frac{n_1^2 n_1^2 a^4 - n_0^2}{(1+n_1^2)(n_1^2 a^4 - n_0^2)}}\right)\times\frac{\lambda}{2\pi n_1}$$

or $$\arccos\left(-\sqrt{\frac{n_1^2 n_1^2 a^4 - n_0^2}{(1+n_1^2)(n_1^2 a^4 - n_0^2)}}\right)\times\frac{\lambda}{2\pi n_1} \le$$

$$d \le \arccos\left(-\sqrt{\frac{\frac{n_1^2}{16}n_1^2 a^4 - n_0^2}{\left(1+\frac{n_1^2}{16}\right)(n_1^2 a^4 - n_0^2)}}\right)\times\frac{\lambda}{2\pi n_1}$$

$$a = \left(\frac{n_1}{n_2}\right)^k$$

is satisfied.

16. A laser device comprising:
a laser medium having an oscillation wavelength $\lambda$ [nm], an effective refractive index $n_0$ and two reflection facets defining an optical resonator;
a first layer formed on at least one reflection facet of said laser medium, made of silicon oxide and having a thickness $d_1$ [nm];
a second layer formed on a surface of said first layer, made of silicon having a refractive index $n_{si}$ and having a thickness $d_2$ [nm];
a third layer formed on a surface of said second layer, made of silicon oxide having a thickness $d_3$ [nm];
wherein the effective refractive index $n_0$ is in a range from 3.18 to 3.28, the thickness $d_1$ is in a range of:

$$(0.11-9.2\times10^{-3}R+2.2\times10^{-4}R^2)\lambda/1.45\pm15,$$

the thickness $d_2$ is in a range of:

$$(-8.7\times10^{-3}+3.5\times10^{-3}R-1.2\times10^{-5}R^2)\times(-3.6+17/n_{si})\lambda\pm15,$$

and the thickness $d_3$ is in a range of:

$$(0.23-4.9\times10^{-3}R+7.7\times10^{-5}R^2)\lambda/1.45\pm15,$$

and R [%] is in a range from 15 to 30.

17. A laser device comprising:
a laser medium having an oscillation wavelength $\lambda$ [nm], an effective refractive index $n_0$ and two reflection facets defining an optical resonator;
a first layer formed on at least one reflection facet of said laser medium, made of aluminum oxide and having a thickness $d_1$ [nm];
a second layer formed on a surface of said first layer, made of silicon having a refractive index $n_{si}$ and having a thickness $d_2$ [nm];
a third layer formed on a surface of said second layer, made of aluminum oxide having a thickness $d_3$ [nm];
wherein the effective refractive index $n_0$ is in a range from 3.18 to 3.28, the thickness $d_1$ is in a range of:

$$(1.7\times10^{-3}+1.1\times10^{-3}R+3.1\times10^{-5}R^2)\lambda/1.72\pm15,$$

the thickness $d_2$ is in a range of:

$$(2.3\times10^{-2}+3.5\times10^{-3}R-5.6\times10^{-5}R^2)\times(-1.4+8.9/n_{si})\lambda\pm15,$$

and the thickness $d_3$ is in a range of:

$$(0.21-1.9\times10^{-3}R+2.1\times10^{-5}R^2)\lambda/1.72\pm15,$$

and R [%] is in a range from 15 to 30.

18. A laser device comprising:
a laser medium having an oscillation wavelength $\lambda$ [nm], an effective refractive index $n_0$ and two reflection facets defining an optical resonator;
a first layer formed on at least one reflection facet of said laser medium, made of silicon oxide and having a thickness $d_1$ [nm];
a second layer formed on a surface of said first layer, made of silicon having a refractive index $n_{si}$ and having a thickness $d_2$ [nm];
a third layer formed on a surface of said second layer, made of aluminum oxide having a thickness $d_3$ [nm];
wherein the effective refractive index $n_0$ is in a range from 3.18 to 3.28, the thickness $d_1$ is in a range of:

$$(-3.1\times10^{-5}+3.6\times10^{-3}R-3.5\times10^{-5}R^2)\lambda/1.45\pm15,$$

the thickness $d_2$ is in a range of:

$$(3.5\times10^{-2}+2.5\times10^{-3}R-3.6\times10^{-5}R^2)\times(-2.6+1.4/n_{si})\lambda\pm15,$$

and the thickness $d_3$ is in a range of:

$$(0.21-1.9\times10^{-3}R+2.1\times10^{-5}R^2)\lambda/1.72\pm15,$$

and R [%] is in a range from 15 to 30.

19. A laser device comprising:

a laser medium having an oscillation wavelength $\lambda$ [nm], an effective refractive index $n_0$ and two reflection facets defining an optical resonator;

a first layer formed on at least one reflection facet of said laser medium, made of aluminum oxide and having a thickness $d_1$ [nm];

a second layer formed on a surface of said first layer, made of silicon having a refractive index $n_{si}$ and having a thickness $d_2$ [nm];

a third layer formed on a surface of said second layer, made of silicon oxide having a thickness $d_3$ [nm];

wherein the effective refractive index $n_0$ is in a range from 3.18 or larger to 3.28 of smaller, the thickness $d_1$ is in a range of:

$$(0.12-1.2\times10^{-2}R+3.2\times10^{-4}R^2)\lambda/1.72\pm15,$$

the thickness $d_2$ is in a range of:

$$(-2.7\times10^{-2}+3.4\times10^{-3}R+2.4\times10^{-5}R^2)\times(-3.8+2.8/n_{si})\lambda\pm15,$$

and the thickness $d_3$ is in a range of:

$$(0.23-4.9\times10^{-3}R+7.7\times10^{-5}R^2)\lambda/1.45\pm15,$$

and R [%] is in a range from 15 to 30.

* * * * *